(12) United States Patent
Cowley

(10) Patent No.: US 7,795,972 B2
(45) Date of Patent: Sep. 14, 2010

(54) AUTOMATIC GAIN CONTROL APPARATUS AND TECHNIQUE

(75) Inventor: Nicholas P. Cowley, Wiltshire (GB)

(73) Assignee: Intel Corporation, Santa Clara, CA (US)

( * ) Notice: Subject to any disclaimer, the term of this patent is extended or adjusted under 35 U.S.C. 154(b) by 76 days.

(21) Appl. No.: 12/204,278

(22) Filed: Sep. 4, 2008

(65) Prior Publication Data

US 2010/0052786 A1    Mar. 4, 2010

(51) Int. Cl.
*H03G 3/20* (2006.01)

(52) U.S. Cl. ........... 330/254; 330/284

(58) Field of Classification Search ............ 330/254, 330/284; 327/359
See application file for complete search history.

(56) References Cited

U.S. PATENT DOCUMENTS 3,908,172 A * 9/1975 Aschermann et al. ....... 330/254
7,403,071 B2 * 7/2008 Hollenbeck et al. ......... 330/254

* cited by examiner

*Primary Examiner*—Steven J Mottola
(74) *Attorney, Agent, or Firm*—Trop, Pruner & Hu, P.C.

(57) ABSTRACT

An amplifier includes steering stages to receive a control signal and collectively provide an output signal. Each steering stage receives an associated input signal and contributes to the output signal based on the control signal. The amplifier includes an attenuator to selectively attenuate the input signals to form different gain control ranges for the amplifier.

17 Claims, 3 Drawing Sheets

AUTOMATIC GAIN CONTROL APPARATUS AND TECHNIQUE

BACKGROUND

The invention generally relates to an automatic gain control apparatus and technique.

The strength of a signal that is received by a radio receiver may significantly vary, depending on such factors as the distance between the source and the receiver, the presence of physical obstructions, the presence of out-of-band blockers, etc. Therefore, a conventional radio receiver includes automatic gain control (AGC) circuitry for purposes of regulating the amplitude of the signal that is processed by the circuitry of the receiver.

A conventional AGC stage may include a differential amplifier that has a differential pair of transistors, which receives a control signal for purposes of controlling the stage's gain. The input signal to the AGC stage may, for example, modulate the tail current of the differential amplifier. Thus, via a gain established by the control signal, the differential amplifier amplifies the input signal to produce the AGC stage's output signal. A conventional AGC stage may include a differential amplifier that has a differential pair of transistors, which receive an input signal at the input, base, terminals. The amplifier stage provides transconductance gain to the input signal outputting a differential current whose amplitude is dependent on the input signal. The output signal may be connected to the common emitter terminal of a second differential pair of transistors, which receive a control signal at the input, base, terminals. The second differential pair will provide a variable output current level and so gain to one of the second differential pair's output, collector, terminals by steering current to or away from said terminal. A conventional AGC stage, such as the above-described AGC stage, may have relatively insufficient noise figure (NF) and/or intermodulation (IM) characteristics, over part or all of the gain control range.

Thus, there exists a continuing need for better ways to control the gain of a signal in a radio receiver.

DETAILED DESCRIPTION

Figure 1:
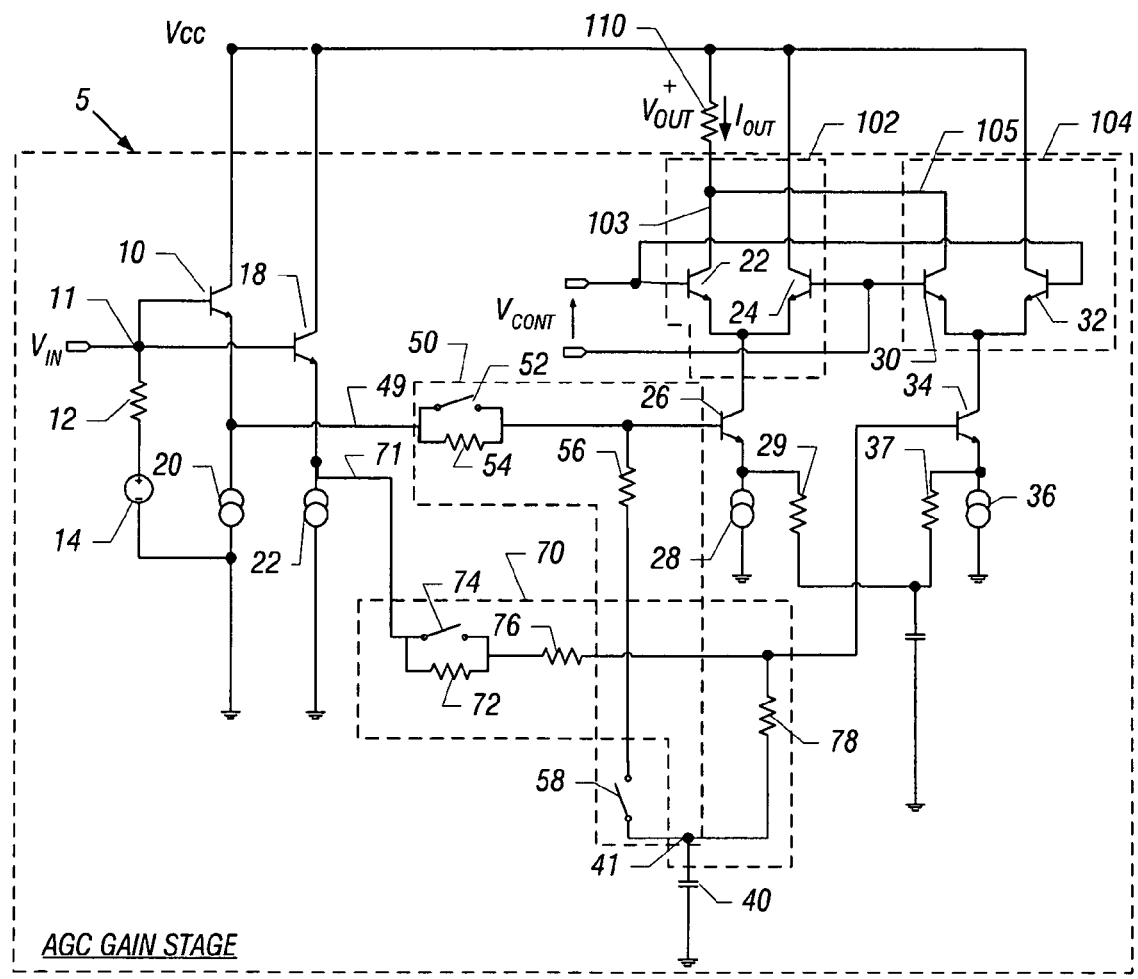
FIG. 1 is a schematic diagram of an automatic gain control (AGC) stage of a radio receiver according to an embodiment of the invention.

Referring to FIG. 1, in accordance with embodiments of the invention, an automatic gain control (AGC) stage 5 has a relatively wide gain control range, which makes the stage 5 suitable for integration in, for example, fabricated semiconductor tuners. The AGC stage 5 is an amplifier that receives an input signal (such as an input voltage called "$V_{IN}$" in FIG. 1) and amplifies the input signal by the amplifier's gain to produce an output signal (such as an output current called "$I_{OUT}$" in FIG. 1). The gain of the AGC stage 5 is regulated by a gain control signal (such as a voltage called "$V_{CONT}$" in FIG. 1) and a programmable attenuator of the stage 5. In accordance with some embodiments of the invention, the programmable attenuator is formed from attenuation circuits 50 and 70.

As described herein, the AGC stage 5 operates in one of multiple gain control ranges. As a non-limiting example, the AGC stage 5 may operate in one of the following selectable gain control ranges: 1.) a first gain control range for which the gain of the AGC stage 5 may be varied from 0 to −6 decibels (dB); 2.) a second gain control range in which the gain of the AGC stage 5 may be varied from −6 to −12 dB; and 3.) a third gain control range in which the gain of the AGC stage 5 may be varied from −12 to −18 dB. For gain control range, the control voltage $V_{CONT}$ may be varied over its same range of control voltages for purposes of controlling the AGC stage's gain, as confined by the limits of the selected gain control range.

The AGC stage 5 is constructed to seamlessly transition between gain control ranges due to current steering stages 102 and 104 of the stage 5. The current steering stages 102 and 104 collectively furnish current (i.e., an output signal) to an output load 110 (represented as a resistor in FIG. 1) in a complimentary fashion based on the $V_{CONT}$ control voltage. More particularly, in accordance with some embodiments of the invention, the steering stages 102 have single-ended output terminals that are connected to the load 110: the steering stage 102 has an output terminal 103 that is connected to the load 110; and the steering stage 104 has an output terminal 105 that is connected to the load 110.

The current into steering stages 102 and 104 are provided by the bipolar junction transistors (BJTs) 26 and 34, respectively, which are further described below. The current is formed from both a standing, DC current and a signal current in proportion to the input voltage $V_{IN}$.

The control voltage $V_{CONT}$ may vary over a predefined range of control voltages for purposes of controlling how much current each steering stage 102, 104 contributes to the load 110. For example, referring to FIG. 2 in conjunction with FIG. 1, in accordance with some embodiments of the invention, the control voltage $V_{CONT}$ may be a voltage (as set by an external controller (not shown in FIG. 1) in a range that spans between a lower voltage threshold (called "$V_{MIN}$") and an upper voltage threshold (called "$V_{MAX}$"). When the control voltage $V_{CONT}$ is near or at the lower voltage threshold $V_{MIN}$, the steering stage 104 contributes substantially all of its current to the load 110, and the steering stage 102 steers all of its current away from the load 110 (i.e., into a positive supply voltage (called "$V_{CC}$"); and conversely, when the control voltage $V_{CONT}$ is near or at the upper threshold $V_{MAX}$, the steering stage 102 contributes substantially all of its current to the load 110, and the steering stage 104 steers all of its current away from the load 110. The AGC gain stage 5 is constructed to be switched from one gain control range to the next without any significant glitch occurring in the $I_{OUT}$ output current. As described below, this switch may occur when the control voltage $V_{CONT}$ is either at or near the lower voltage threshold $V_{MIN}$ or at or near the upper voltage threshold $V_{MAX}$.

Figure 2:
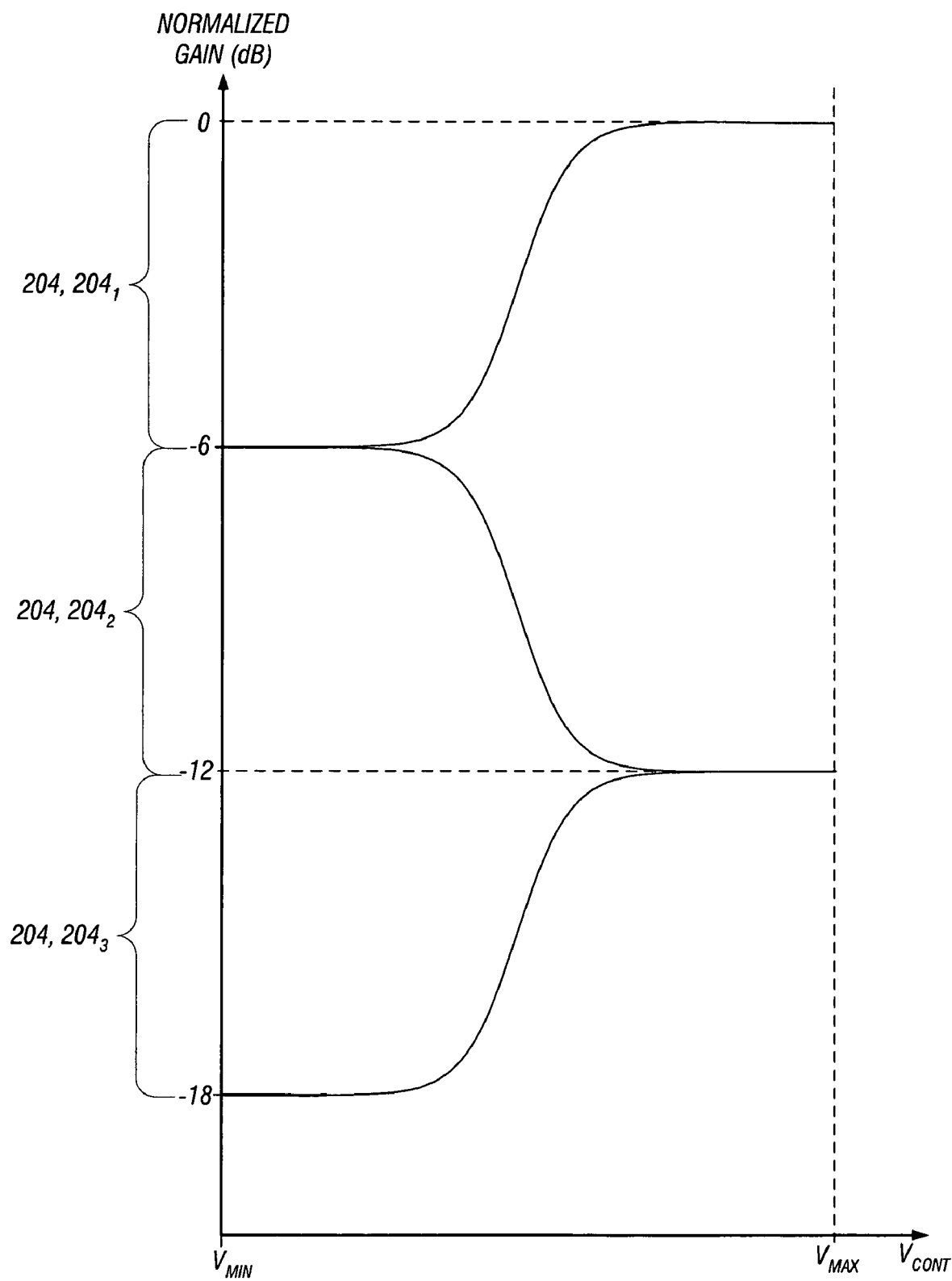
FIG. 2 is an illustration of gain control ranges of the AGC stage of FIG. 1 according to an embodiment of the invention.

FIG. 2 depicts three exemplary control ranges $204_1$, $204_2$ and $204_3$, in accordance with some embodiments of the invention. In the following, the reference numeral "204" is used to generally refer to the control range, with the numerical subscripts being used (such as $204_1$) being used to refer a specific gain control range. As an example, at power up of the AGC stage 5, the first gain control range $204_1$ may be selected by default. As shown in FIG. 2, over this range, the gain control voltage $V_{CONT}$ may be controlled to effectively impart a normalized gain for the stage 5 between −6 decibels and unity, or 0 dB. Thus, for the first gain control range $204_1$, the control voltage $V_{CONT}$ may be controlled from its lower threshold $V_{MIN}$, which causes the stage 5 to have a –6 dB gain to its upper threshold $V_{MAX}$, which causes the stage 5 to have its maximum gain of 0 dB.

When the control voltage $V_{CONT}$ is at the lower threshold $V_{MIN}$, the steering stage 102, contributes essentially no input current to the load 110. However, at the lower threshold $V_{MIN}$, the steering stage 104, supplies substantially all of the input current to the load 110. As further described below, for the gain control range $204_1$, the input signal to the BJT 34, which provides the input current to the steering stage 104 experiences an attenuation of 6 dB, and the input signal to the BJT 26, which provides the input current to the steering stage 102 experiences an attenuation of 0 dB. When the control voltage $V_{CONT}$ is at or near the lower threshold $V_{MIN}$, the steering stage 104 provides all of the signal current into the output load 110 and therefore establishes a relative gain of –6 dB for the AGC stage 5.

As the control voltage $V_{CONT}$ increases, the steering stage 102 provides more of its input current to the load 110, and the steering stage 104 provides less of its input current to the load 110. When the control voltage $V_{CONT}$ reaches the upper threshold $V_{MAX}$, the steering stage 104 provides essentially no current to the output load 110, and the steering stage 102 furnishes substantially all of its input current to the load 110. At this point, the gain of the AGC stage 5 is 0 dB, as the input signal to the BJT 26, which provides the input current to the steering stage 102 experiences essentially no attenuation.

The 6 dB span of a given gain control range 204, such as the gain control range $204_1$, may be insufficient by itself for some applications. However, the overall gain control range of the AGC stage 5 is not so limited, because the AGC stage 5 may be switched among multiple gain control ranges 204, and thus, for the example that is depicted in FIG. 2 has an overall gain control range of 18 dB. Thus, for example, the AGC stage 5 may switched from the gain control range $204_1$ to the gain control range $204_2$ when more than 6 db attenuation is needed. The AGC stage 5 is constructed for the transition from the gain control range $204_1$ to the gain control range $204_2$ to occur when the steering stage 104 provides substantially all of the output to the load 110 (i.e., when the control voltage $V_{CONT}$ is near or at the lower threshold $V_{MIN}$). During this state of the AGC stage 5, the attenuation to the steering stage 102 may be changed to increase the attenuation that is applied to the input signal that is received by the BJT 26 which provides current to the steering stage 102, and because the steering stage 102 is essentially not providing any current to the load 110 during this transition, a glitch is not introduced in the $I_{OUT}$ output current.

More specifically, in accordance with some embodiments of the invention, the attenuation applied to the input signal that is received by the BJT 26 providing current to the steering stage 102 may be decreased to –12 dB when the control $V_{CONT}$ is at the lower threshold $V_{MIN}$. Therefore, upon this change, the input signal to BJT 26, which provides current to the steering stage 102 is attenuated by 12 dB, and the input signal to BJT 34, which provides current to the steering stage 104 remains attenuated by 6 dB. With this change in attenuation, the AGC stage 5 has been switched from the first gain control range $204_1$, to the second gain control range $204_2$.

For the gain control range $204_2$, the gain of the AGC stage 5 may be varied by the control voltage $V_{CONT}$ between –6 dB and –12 dB. As can be appreciated from FIG. 2, the gain of the AGC stage 5 negatively varies with respect to the control voltage $V_{CONT}$ in the gain control range $204_2$, as opposed to the gain control range $204_1$, in which the gain positively varies with respect to the control voltage $V_{CONT}$.

The AGC stage 200 may be transitioned to additional gain control ranges 204, such as the exemplary gain control range $204_3$. To transition to the gain control range $204_3$ (from the gain control range $204_2$, for example), the control voltage $V_{CONT}$ is increased to the upper threshold $V_{MAX}$ to effectively cause the steering stage 102 to supply substantially all of the current to the load 110. Thus, at this point, the steering stage 104 provides essentially no current to the load 110, which allows the input attenuation of the steering stage 104 to be changed without introducing a glitch in the $I_{OUT}$ current. For this example, the input attenuation to BJT 34, which provides current to the steering stage 104 is decreased to 18 dB. Therefore, at this point, the AGC stage 5 has been placed in the gain control region $204_3$; and the control voltage $V_{CONT}$ may be varied between the lower $V_{MIN}$ and upper $V_{MAX}$ thresholds for purposes of regulating the gain of the AGC stage 5 between –18 dB and –12 dB. As shown in FIG. 2, the gain of the AGC stage 5 positively varies with respect to the control voltage $V_{CONT}$ in the gain control range $204_3$.

It is noted that FIG. 1 depicts an exemplary architecture for the AGC stage 5, in accordance with some embodiments of the invention. However, the AGC topology that is depicted in FIG. 1 is merely an example of many potential designs for the AGC gain stage in accordance with the many possible embodiments of the invention. Although FIG. 1 depicts the AGC stage 5 as being implemented using bipolar technology, the AGC stage 5 may be implemented in other process technologies (a complimentary metal oxide semiconductor (CMOS) process technology, for example), as can be appreciated by one of skill in the art. Furthermore, although three gain control ranges 204 are described herein, the AGC gain stage may have fewer or more than three gain control ranges, in accordance with other embodiments of the invention.

For the example that is depicted in FIG. 1, each steering stage 102, 104 is a differential amplifier stage, which contains a matched differential pair of bipolar junction transistors (BJTs). The emitter terminals of each differential pair are coupled together; one of the collector terminals of the differential pair is coupled to the load 110; the other collector terminal of the differential pair is coupled to the $V_{CC}$ positive supply voltage; and the control voltage $V_{CONT}$ is received across the base terminals of the differential pair.

More specifically, in accordance with some embodiments of the invention, the steering stage 102 includes a differential pair of matched BJTs 22 and 24, which are coupled together at their emitter terminals and provide the current steering for the stage 102. The control voltage $V_{CONT}$ appears across the base terminals of the BJTs 22 and 24 such that the BJT 22 conducts more current (and the BJT 24 conducts less current) with an increasing control voltage $V_{CONT}$, and vice versa. The collector of the BJT 22 is connected to supply current to the load 110.

For the steering stage 104, a differential pair of matched BJTs 30 and 32 are coupled together at their emitter terminals and provide the current steering for the stage 104. The collector terminal of the BJT 30 is connected to the collector terminal of the BJT 22 (and to the load 110); and the collector terminal of the BJT 32 is connected to the positive voltage supply $V_{CC}$. The control voltage $V_{CONT}$ appears across the base terminals of the BJTs 32 and 30 such that the BJT 30 conducts more current (and the BJT 32 conducts less current) with a decreasing control voltage $V_{CONT}$, and vice versa.

Each steering stage 102, 104 is biased by a corresponding current source. In this regard, a current source 28 establishes the "tail current" for the steering stage 102, and a current source 36 establishes a tail current for the steering stage 104. The gain associated with steering stage 102 is determined by the transconductance of the stage BJT 26, which is set by a current source 28 and an emitter load resistance 29; and similarly the gain associated with steering stage 104 is determined by the transconductance of the stage BJT 36, which is set by a current source 36 and an emitter load resistance 37. In accordance with some embodiments of the invention, the current sources 28 and 36 establish approximately the same bias current in each steering stage 102 and 104. Neglecting any current perturbation caused by the input voltages (described below) to the steering stages 102 and 104, the stages' collective bias contribution to the load 110 remains constant, regardless of the magnitude of the control voltage $V_{CONT}$, as the control voltage $V_{CONT}$ merely controls the current allocation of the stages 102 and 104 to the constant bias current. The components of the $V_{CONT}$ control voltage provided to the steering stages 102 and 104 are equal in magnitude and opposite in sign. As specific examples, one control voltage $V_{CONT}$ value may cause the steering stage 102 to contribute 20 percent and the steering stage 104 to contribute 80 percent; and another control voltage $V_{CONT}$ value may cause the steering stage 102 to contribute 60 percent and the steering stage 104 to contribute 40 percent.

An input signal is introduced into each steering stage 102 and 104 via a transistor that has its main current path coupled to the emitter terminals of the transistors of the steering stage 102, 104. More specifically, for the steering stage 102, a BJT 26 has its collector-to-emitter current path that is coupled in series with the current source 28; and for the steering stage 104, a BJT 34 has its collector-to-emitter current path that is coupled in series with the current source 36. The BJT 26 provides the gain for the steering stage 102, and the BJT 28 provides the gain for the steering stage 104.

The base terminals of the BJTs 26 and 34 receive respective input signals. These input signals, in turn, are generated by an attenuator (formed from attenuation circuits 50 and 70), which attenuates the input voltage $V_{IN}$ to the AGC stage 5 by different programmable degrees of attenuation to generate the input signals for the BJTs 26 and 34. As further described below, the attenuation circuit 50 attenuates the input voltage $V_{IN}$ by a selectable, or programmable, attenuation to provide the corresponding input signal to the steering stage 102; and the attenuation circuit 70 attenuates the input voltage $V_{IN}$ by a selectable, or programmable, attenuation to produce a corresponding input voltage that is provided to the steering stage 104.

In accordance with some embodiments of the invention, the AGC stage 5 includes voltage followers, such as emitter followers, for purposes of generating the signals that are then attenuated by the attenuation circuits 50 and 70. More specifically, the AGC stage 5 includes a first emitter follower that is formed from a BJT 10 and a current source 20 for purposes of providing an input signal to an input terminal 49 to the attenuation circuit 50. The base terminal of the BJT 10 is connected to the node 11 that receives the input voltage $V_{IN}$; the collector terminal of the BJT 10 is connected to the positive supply voltage $V_{CC}$; and the emitter terminal of the BJT 10 is connected to the input terminal 49 and the current source 20. It is noted that the base terminal of the BJT 10 may be biased by a biasing network, which includes the series combination of a resistor 12 and a voltage reference source 14, which are connected between the base terminal of the BJT 10 and ground. It is noted that this biasing network establishes the input resistance for the AGC stage 5.

Similarly, an emitter follower that provides the input signal to the attenuation circuit 70 may be formed from a BJT 18 and a current source 22. The base terminal of the BJT 18 is connected to the node 11; the collector terminal of the BJT 18 is connected to the positive voltage supply $V_{CC}$; and the emitter terminal of the BJT 18 is connected to the input terminal 71 and to the current source 22.

Thus, the input terminals 49 and 71 for the attenuation circuits 50 and 70, respectively, receive buffered versions of the input voltage $V_{IN}$; and the input signal to each attenuation circuit 50, 70 may be approximately equal to the input voltage $V_{IN}$, in accordance with embodiments of the invention.

In accordance with some embodiments of the invention, the attenuation circuit 50 includes a resistor 54 that is coupled in parallel with a switch 52. The parallel combination of the switch 52 and the resistor 54 is coupled in series between the input terminal 49 and the base terminal of the BJT 26 associated with the steering stage 102. A series combination of a resistor 56 and a switch 58 is coupled between the base terminal of the BJT 26 and a node 41. A DC-blocking capacitor 40 is coupled between the node 41 and ground.

The switches of the attenuation circuit 50 as well as the switches of the attenuation circuit 70 may be selectively controlled (i.e., opened or closed) via switch control signals that are furnished by an AGC controller (not shown in FIG. 1).

For the gain control range $204_1$ (see FIG. 2), the switch 52 is closed (thereby shunting the resistor 54 with approximately zero resistance), and the switch 58 is open. For this state, the attenuation circuit 50 does not significantly attenuate the input voltage $V_{IN}$, and therefore, the attenuation circuit 50 is associated with a 0 dB attenuation (i.e., the signal provided to the base terminal of the BJT 26 is essentially the same as the signal received at the input terminal 49 of the attenuation circuit 50). For purposes of transitioning the AGC stage 5 to the second gain control range $204_2$, the switch 52 is open, and the switch 58 is closed. For this state of the attenuation circuit 50, a resistor divider formed by the resistors 54 and 56 attenuates the input voltage $V_{IN}$ by –12 dB. The transition of the switch states occurs, in accordance with some embodiments of the invention, when the control voltage $V_{CONT}$ is near or at the lower threshold $V_{MIN}$ and thus, occurs when the steering stage 102 contributes essentially no current to the load.

In accordance with some embodiments of the invention, the attenuation circuit 70 includes a parallel combination of a resistor 72 and a switch 74, and this parallel combination is coupled in series between the input terminal 71 of the attenuation circuit 70 and a base terminal of the BJT 34 associated with the steering stage 104. A resistor 78 is coupled between the base terminal of the BJT 34 and the node 41. For the gain control range $204_1$, the switch 74 is closed to therefore shunt the resistor 72 with approximately zero resistance. Therefore, for the gain control range $204_1$, the resistor divider formed from the resistors 76 and 78 attenuates the input voltage $V_{IN}$ by 6 dB.

For purposes of transitioning the AGC stage 5 from the gain control range $204_2$ to the gain control range $204_3$, the switch 74 is opened, thereby adding the additional resistance from the resistor 72 in series with the resistance of the resistor 76. For this state, a resistor divider formed from the resistors 72, 76 and 78 attenuates the input voltage $V_{IN}$ by –18 dB. As discussed above, the switch 74 is opened when the control voltage $V_{CONT}$ is near or at the upper threshold $V_{MAX}$ so that the steering stage 104 contributes essentially no current to the load 110.

It is noted that the attenuator, attenuation circuits and attenuations that are set forth herein as specific examples may be modified, in accordance with other embodiments of the invention. Thus, for example, other switching arrangements may be used, such as the switching of parallel rather than series resistive elements. Similarly, the resistor divider may impart attenuations other than attenuations that are multiples of 6 dB, in accordance with other embodiments of the invention.

As other examples of additional embodiments of the invention, the single ended outputs of the steering stages 102 and 104 may be replaced with differential output connections. It is noted that the resistors described herein may be explicit resistors, or as another example, may be formed from limiting field effect transistor (FET) switches, such that there is a minimum distortion added to the signal path through the FET non-linearities.

In such examples the input transconductance stage associated with the steering stages (i.e., either the transconductance stage associated with the BJT 26 or the transconductance stage associated with the BJT 34) may be a differential stage that provides differential signals to the steering stages, which are configured to provide a differential output. In addition, the input attenuation arrangements may also be implemented differentially and provide a differential input to the differential transconductance stages. Similarly, the input to the differential attenuation stages may accommodate a differential input. This differential input may receive a differential input voltage representing the input voltage $V_{IN}$ or a single ended input with the complementary input decoupled. Thus, as can be appreciated by one of skill in the art, many variations are contemplated and are within the scope of the appended claims.

In accordance with embodiments of the invention, a compound gain $$\left(\frac{V_{OUT}}{V_{IN}}\right)$$

of the stage 5 may be expressed as follows:

$$\text{Compound gain} = \frac{V_{OUT}}{V_{IN}} = \frac{G}{2} * \left((A_1 - A_2) * \tanh\left(\frac{V_{cont}}{V_T}\right) + A_1 + A_2\right),$$

where "G" represents the gain of the transconductance stages (i.e., the stages associated with the BJTs 26 and 34) associated with differential steering stages 102 and 104; "$A_1$" represents the gain of the attenuator 50; "$A_2$" represents the gain of the attenuator 70; and "$V_T$" represents the BJT thermal voltage.

The advantages of the AGC stages that are disclosed herein, such as the AGC stage 5, may include one or more of the following. The AGC stage may deliver a noise figure (NF) and intermodulation intercept that vary by 1 dB/dB with gain back off at a power dissipation substantially determined by the minimum level of input voltage $V_{IN}$ rather than the maximum level of the input voltage $V_{IN}$. Thus, the AGC stage may dissipate relatively little power. The AGC stage may use a significantly lower intermodulation intercept at maximum gain/minimum NF to deliver the required intermodulation intercept at minimum gain, which results in a significantly reduced current. The AGC stage may maintain a fixed DC value on the load resistance, which then maintains a constant DC value into the input of following stages. Thus, the AGC stage may maintain a constant collector bias, which considerably eases cell design. The suppression of the change in DC value with gain setting may prevent the introduction of DC dependent amplitude modulation. Other and different advantages are possible in accordance with other embodiments of the invention.

Figure 3:
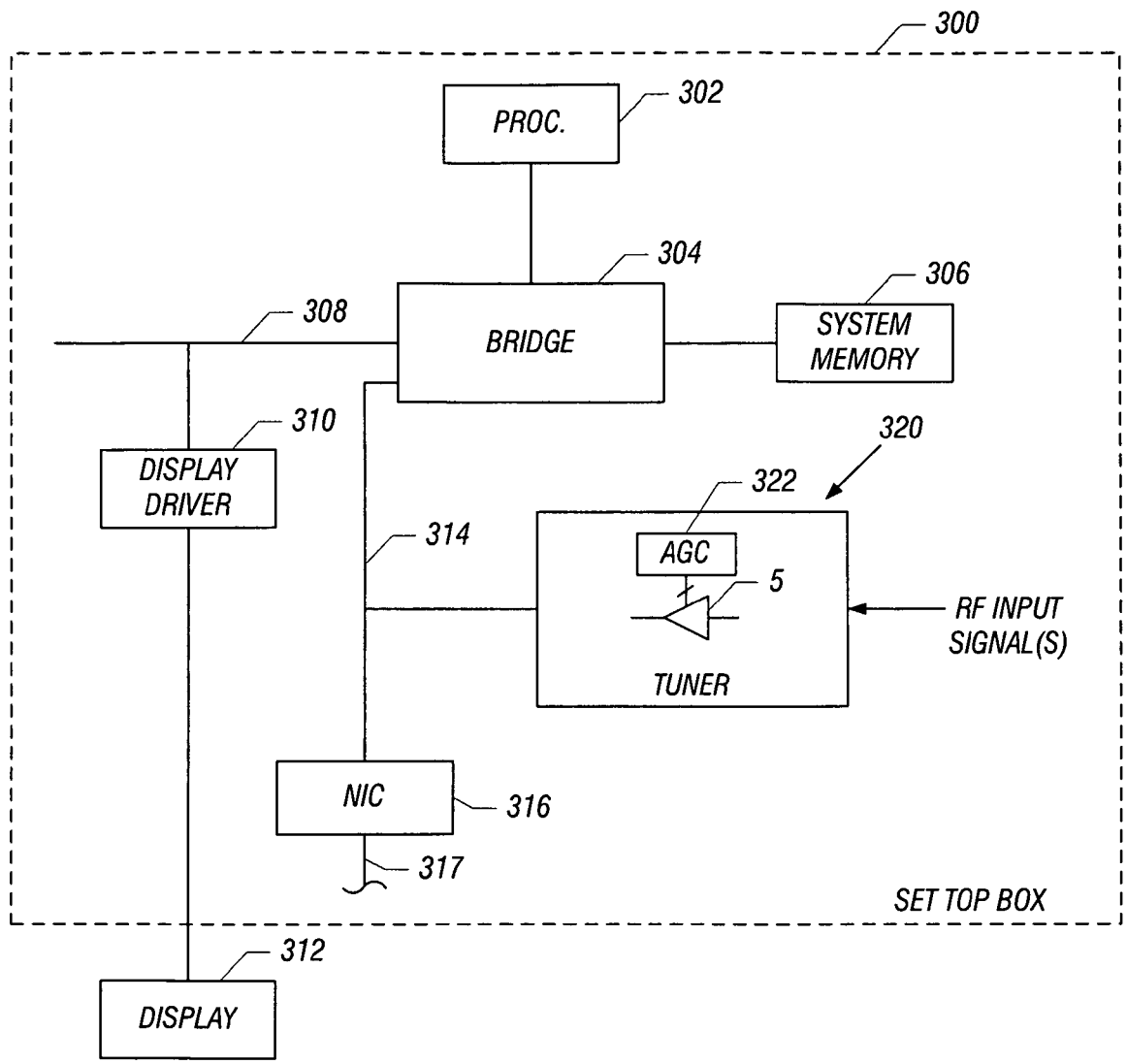
FIG. 3 is a schematic diagram of a set top box according to an embodiment of the invention.

The AGC stage 5 may be used in a variety of applications, depending on the particular embodiment of the invention. Referring to FIG. 3, as a non-limiting example, in accordance with some embodiments of the invention, the AGC stage 5 may be part of a radio front end. As a more specific and non-limiting example, the AGC stage 5 may be used to control the gain of an radio frequency (RF) stage of an RF tuner 320. The tuner 320 may also include, for example, an AGC controller 322 for purposes of monitoring the strength of the input signal to the AGC gain stage 5 and generating the appropriate control voltage $V_{CONT}$ and switching signals for the attenuation circuits 50 and 70 to control the AGC stage's gain.

In accordance with some embodiments of the invention, the radio receiver 320 may be a silicon tuner that is part of a set top box 300. As an example, the radio receiver 320 may be used for purposes of receiving one or more RF input signals, such as cable and/or satellite RF input signals. In general, the set top box 300 may include at least one processor 302, such as a single core or multicore microprocessor, in accordance with some embodiments of the invention.

In general, the processor 302 may be coupled to other system components via one or more bridges 304. The bridge(s) 304 may couple the processor 302 to a system memory 306 as well as to various buses, such as a video output bus 308 and an expansion bus 314. A display driver 310 may be coupled to the bus 308 and drive a corresponding display 312. A network interface card (NIC) 316 may be coupled to the expansion bus 314 and establish network communication to a network 317. Additionally, in accordance with some embodiments of the invention, the tuner 320 may be coupled to the expansion bus 314, as depicted in FIG. 3, although the radio receiver 320 may be coupled to another bus of the set top box 300, in accordance with other embodiments of the invention.

It is noted that the schematic diagram depicted in FIG. 3 is simplified for purposes of illustrating incorporation of the AGC stage 5. Thus, the set top box 300 may contain various other components, in accordance with other embodiments of the invention. Furthermore, the AGC stage 5 may be incorporated into other processor-based and non-processor-based systems in accordance with other embodiments of the invention. Thus, many variations are contemplated and are within the scope of the appended claims.

While the present invention has been described with respect to a limited number of embodiments, those skilled in the art, having the benefit of this disclosure, will appreciate numerous modifications and variations therefrom. It is intended that the appended claims cover all such modifications and variations as fall within the true spirit and scope of this present invention.

What is claimed is:

1. An amplifier comprising:
    steering stages to receive a control signal and collectively provide an output signal, each steering stage to receive an associated input signal and contribute to the output signal based on the control signal; and
    an attenuator to selectively attenuate the input signals to form different gain control ranges for the amplifier, wherein
    a gain of the amplifier positively varies with respect to the control signal over at least one of the gain control ranges, and the gain of the amplifier negatively varies with respect to the control signal over at least one of the gain control ranges.

2. The amplifier of claim 1, wherein the steering stages each comprise a differential pair of transistors.

3. The amplifier of claim 1, wherein the output signal comprises a single ended output signal.

4. The amplifier of claim 1, wherein the steering stages complementarily contribute to the output signal such that a bias level of the output signal is substantially independent of the control signal.

5. The amplifier of claim 1, wherein
the steering stages complementarily contribute to the output signal,
the control signal varies between a first threshold and a second threshold,
a first steering stage of the steering stages minimally contributes to the output signal relative to the other one or more steering stages in response to the control signal being near the first threshold; and
a second steering stage of the steering stages minimally contributes to the output signal relative to the other one or more steering stages in response to the control signal being near the second threshold.

6. The amplifier of claim 1, wherein
the steering stages complementarily contribute to the output signal, and
the attenuator changes an attenuation introduced to the input signal associated with a given steering stage in response to the given steering stage minimally contributing to the output signal relative to the other one or more steering stages.

7. The amplifier of claim 1, wherein the amplifier comprises an automatic gain control stage of a radio.

8. A method comprising:
controlling steering stages of an automatic gain control stage to form an output signal, the act of controlling comprising varying a control signal; and
selectively attenuating input signals associated with the steering stages to form different gain control ranges for the automatic gain control stage, wherein
a gain of the automatic gain control stage negatively varies with respect to the control signal over at least one of the gain control ranges, and
the gain of the automatic gain control stage positively varies with respect to the control signal over at least one of the gain control ranges.

9. The method of claim 8, wherein the controlling comprises causing the steering stages to complimentarily contribute to the output signal such that a bias level of the output signal is substantially independent of the controlling.

10. The method of claim 8, wherein the controlling comprises:
varying a control signal between a first threshold and a second threshold;
causing a first steering stage of the steering stages to minimally contribute to the output signal relative to the other one or more steering stages in response to the control signal being near the first threshold; and
causing a second steering stage of the steering stages to minimally contribute to the output signal relative to the other one or more steering stages in response to the control signal being near the second threshold.

11. The method of claim 8, wherein the control signal varies between a first threshold and a second threshold, and
wherein the act of attenuating comprises changing the degree in which the input signals are attenuated in response to the control signal being near one of the first and second thresholds.

12. A system comprising:
an automatic gain controller to provide a control signal to regulate a gain applied to a first signal; and
an automatic gain control stage, comprising:
an input stage to generate a plurality of second signals in response to the first signal;
steering stages to receive the control signal and collectively provide an output signal, each steering stage to receive an associated second signal of the second signals and contribute to the output signal based on the control signal; and
an attenuator to selectively attenuate the second signals to form different gain control ranges for the automatic gain control stage.

13. The system of claim 12, further comprising:
a radio receiver, comprising the gain controller and the amplifier.

14. The system of claim 13, further comprising:
a processor to process the output signal.

15. The system of claim 12, wherein
the steering stages complementarily contribute to the output signal,
the control signal varies between a first threshold and a second threshold,
a first steering stage of the steering stages minimally contributes to the output signal relative to the other one or more steering stages in response to the control signal being near the first threshold; and
a second steering stage of the steering stages minimally contributes to the output signal relative to the other one or more steering stages in response to the control signal being near the second threshold.

16. The system of claim 12, wherein
the steering stages complementarily contribute to the output signal, and
the attenuator changes an attenuation introduced to the input signal associated with a given steering stage in response to the given steering stage minimally contributing to the output signal relative to the other one or more steering stages.

17. The system of claim 12, wherein
a gain of the automatic gain control stage positively varies with respect to the control signal over at least one of the gain control ranges, and
the gain of the amplifier negatively varies with respect to the control signal over at least one of the gain control ranges.

* * * * *